United States Patent
Lee

(10) Patent No.: US 9,253,919 B2
(45) Date of Patent: Feb. 2, 2016

(54) ELECTRONIC COMPONENT COOLING SYSTEM AND METHOD

(71) Applicant: Brocade Communications Systems, Inc., San Jose, CA (US)

(72) Inventor: Michael K. T. Lee, San Jose, CA (US)

(73) Assignee: BROCADE COMMUNICATIONS SYSTEMS, INC., San Jose, CA (US)

( * ) Notice: Subject to any disclaimer, the term of this patent is extended or adjusted under 35 U.S.C. 154(b) by 196 days.

(21) Appl. No.: 14/106,414

(22) Filed: Dec. 13, 2013

(65) Prior Publication Data

US 2015/0124405 A1  May 7, 2015

Related U.S. Application Data

(60) Provisional application No. 61/900,179, filed on Nov. 5, 2013.

(51) Int. Cl.
| | | |
|---|---|---|
| *H05K 7/20* | (2006.01) | |
| *F04D 29/60* | (2006.01) | |
| *F04D 25/16* | (2006.01) | |

(52) U.S. Cl.
CPC .......... *H05K 7/20172* (2013.01); *F04D 25/166* (2013.01); *F04D 29/601* (2013.01); *Y10T 137/0402* (2015.04)

(58) Field of Classification Search
CPC . F04D 25/166; F04D 29/601; H05K 7/20172; Y10T 137/0402
USPC ........................ 361/679.46–679.54, 688–723; 165/80.1–80.3; 454/184–186, 454/228–368; 415/203, 213.1
See application file for complete search history.

(56) References Cited

U.S. PATENT DOCUMENTS

| | | | | |
|---|---|---|---|---|
| 6,678,157 | B1 * | 1/2004 | Bestwick ...................... | 361/695 |
| 6,795,314 | B1 * | 9/2004 | Arbogast et al. .............. | 361/695 |
| 2002/0054479 | A1 * | 5/2002 | Wu ................................ | 361/695 |
| 2004/0115986 | A1 * | 6/2004 | Chen ............................. | 439/485 |
| 2007/0133167 | A1 * | 6/2007 | Wagner et al. ................ | 361/687 |
| 2008/0239665 | A1 * | 10/2008 | Franz et al. ................... | 361/695 |
| 2010/0097758 | A1 * | 4/2010 | Franz et al. ................... | 361/694 |
| 2010/0230076 | A1 * | 9/2010 | Yang et al. ............... | 165/104.26 |
| 2011/0110029 | A1 * | 5/2011 | Lodhia et al. ............ | 361/679.47 |

(Continued)

OTHER PUBLICATIONS

Lee, "High Efficient Power Saving and Cooling Method for Fixed From-Factor Chassis Systems", U.S. Appl. No. 61/900,179, filed Nov. 5, 2013.

(Continued)

*Primary Examiner* — Anthony Haughton
*Assistant Examiner* — Yahya Ahmad
(74) *Attorney, Agent, or Firm* — Innovation Counsel LLP; Serge J. Hodgson

(57) ABSTRACT

An electronic device includes a fan field replaceable unit (FRU). The fan FRU includes a fan FRU chassis defining an airflow pathway through the fan FRU. A fan within the fan FRU chassis causes air to flow along the airflow pathway. The fan FRU further includes an edge connector located at a front face of the fan FRU out of the way of the airflow pathway. Accordingly, the edge connector does not block airflow through the fan FRU thus maximizing the efficiency of the fan FRU and the cooling of the electronic device.

20 Claims, 7 Drawing Sheets

(56) References Cited

U.S. PATENT DOCUMENTS

| | | | |
|---|---|---|---|
| 2012/0134113 A1* | 5/2012 | Lai | 361/695 |
| 2014/0022724 A1* | 1/2014 | Chao et al. | 361/679.47 |
| 2014/0029191 A1* | 1/2014 | Terwilliger | 361/679.31 |
| 2014/0177168 A1* | 6/2014 | Scott et al. | 361/679.54 |
| 2014/0308121 A1* | 10/2014 | Tang | 415/220 |

OTHER PUBLICATIONS

Installing or replacing fan trays, Brocade FastIron ICX 6610 Stackable Switch Hardware Installation Guide, R07.4.00, Part No. 53-1002504-02, retrieved on Feb. 24, 2014 from http://www.brocade.com/downloads/documents/html_product_manuals/FI_ICX6610_0740 . . . .

* cited by examiner

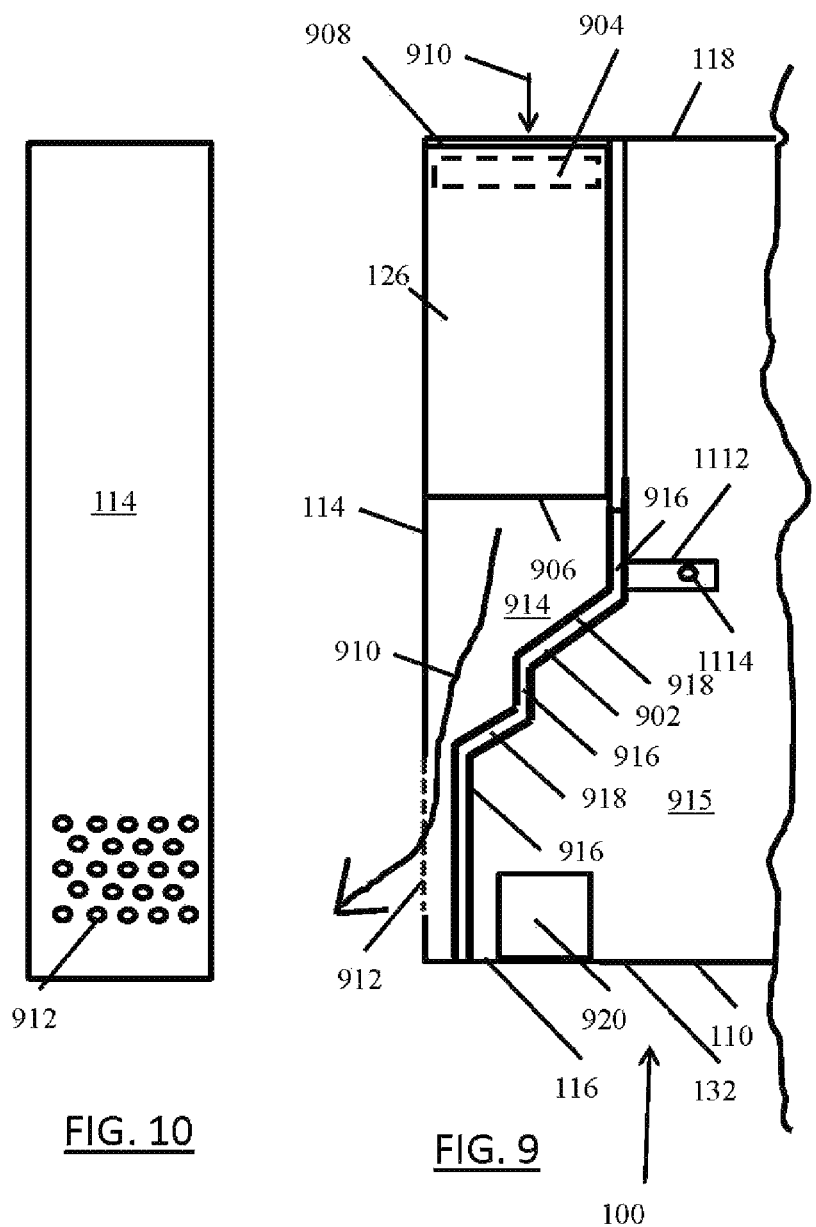

ELECTRONIC COMPONENT COOLING SYSTEM AND METHOD

RELATED APPLICATIONS

This application claims the benefit of U.S. Provisional Application No. 61/900,179 filed on Nov. 5, 2013, entitled "High efficient power saving and cooling method for fixed form-factor chassis systems" of Michael K. T. Lee, which is incorporated herein by reference in its entirety.

BACKGROUND

1. Field

The present application relates to the field of electronics, and more particularly, to structures for cooling electronic components and related methods.

2. Description of the Related Art

An electronic device typically includes a plurality of electronic components contained within an electronic enclosure. During use, these electronic components generate heat, which must be removed from the electronic enclosure.

In one example, the electronic enclosure is formed with a plurality of openings to allow airflow through the electronic enclosure. Fans are provided to move air through the electronic enclosure between the openings.

The fans are provides as fan Field Replaceable Units (fan FRUs). These fan FRUs plug into the motherboard of the electronic component with blind mate connectors. These blind mate connectors are located directly in the airflow pathway of the fans, e.g., blocking 50% or more of the air flow. This reduces efficiency in cooling of the electronic device.

Further, the fan FRUs provide a linear flow of air through the electronic enclosure, e.g., from the back of the fan FRUs to the front of the fan FRUs. Unfortunately, fan side electronic components located adjacent sides of the fan FRUs receive little air flow and thus little cooling from the fan FRUs. Stated another way, the airflow from the fan FRUs bypasses the fan side electronic components. This air bypass reduces the efficiency in cooling of the fan side electronic components.

Further, upstream electronic components heat the air flow as it passed by the upstream electronic components. Downstream electronic components located downstream of the upstream electronic components thus receive air that has been preheated by the upstream electronic components.

Accordingly, the downstream electronic components receive air that is preheated to be at a temperature above ambient temperature. This phenomenon is sometimes called heat shadowing. Heat shadowing reduces the efficiency in cooling of the downstream electronic components.

To provide adequate airflow and cooling, additional and/or larger fans are sometimes needed. Unfortunately, these additional and/or larger fans add to both the manufacturing and operating costs of the electronic device.

SUMMARY

An electronic device includes a fan field replaceable unit (FRU). The fan FRU includes a fan FRU chassis defining an airflow pathway through the fan FRU. A fan within the fan FRU chassis causes air to flow along the airflow pathway. The fan FRU further includes an edge connector located at a front face of the fan FRU out of the way of the airflow pathway.

Accordingly, the edge connector does not block airflow through the fan FRU thus maximizing the efficiency of the fan FRU and the cooling of the electronic device.

In one embodiment, a fan side electronic component is located between a pair of fan FRUs and at the sides of the fan FRUs. The fan FRUs include fan FRU chassis sidewalls having side venting ports therein. During operation, air is drawn across the fan side electronic component and into the side venting ports of the fan FRUs.

In this manner, airflow is provided to the fan side electronic component using multiple airflow paths to provide efficient cooling thereof. This is in contrast to having air flow through the fan FRUs bypass the fan side electronic component.

In accordance with yet another embodiment, an electronic device includes a chassis base. The chassis base includes a first sidewall having a first airflow port therein and a front plate having a second airflow port therein. An airflow dividing baffle defines a first airflow chamber and a second airflow chamber. The first airflow port is a port for the first airflow chamber. The second airflow port is a port for the second airflow chamber.

By providing the airflow dividing baffle, heated air discharged from a first electronic component is vented directly to the ambient environment through the first airflow chamber and first airflow port. The heated air is discharged without preheating other components of the electronic device such as those electronic components located within the second airflow chamber. In this manner, cooling efficiency of the electronic device is maximized.

These and other features in accordance with various embodiments will be more readily apparent from the detailed description set forth below taken in conjunction with the accompanying drawings.

BRIEF DESCRIPTION OF THE DRAWINGS

FIG. 9 is a top plan view of a portion of the electronic device of FIG. 1 including a sidewall and an adjacent power supply unit in accordance with one embodiment;

FIG. 10 is a side plan view of the sidewall of the electronic device of FIG. 1 in accordance with one embodiment.

In the following description, the same or similar elements are labeled with the same or similar reference numbers.

DETAILED DESCRIPTION

Figure 1:
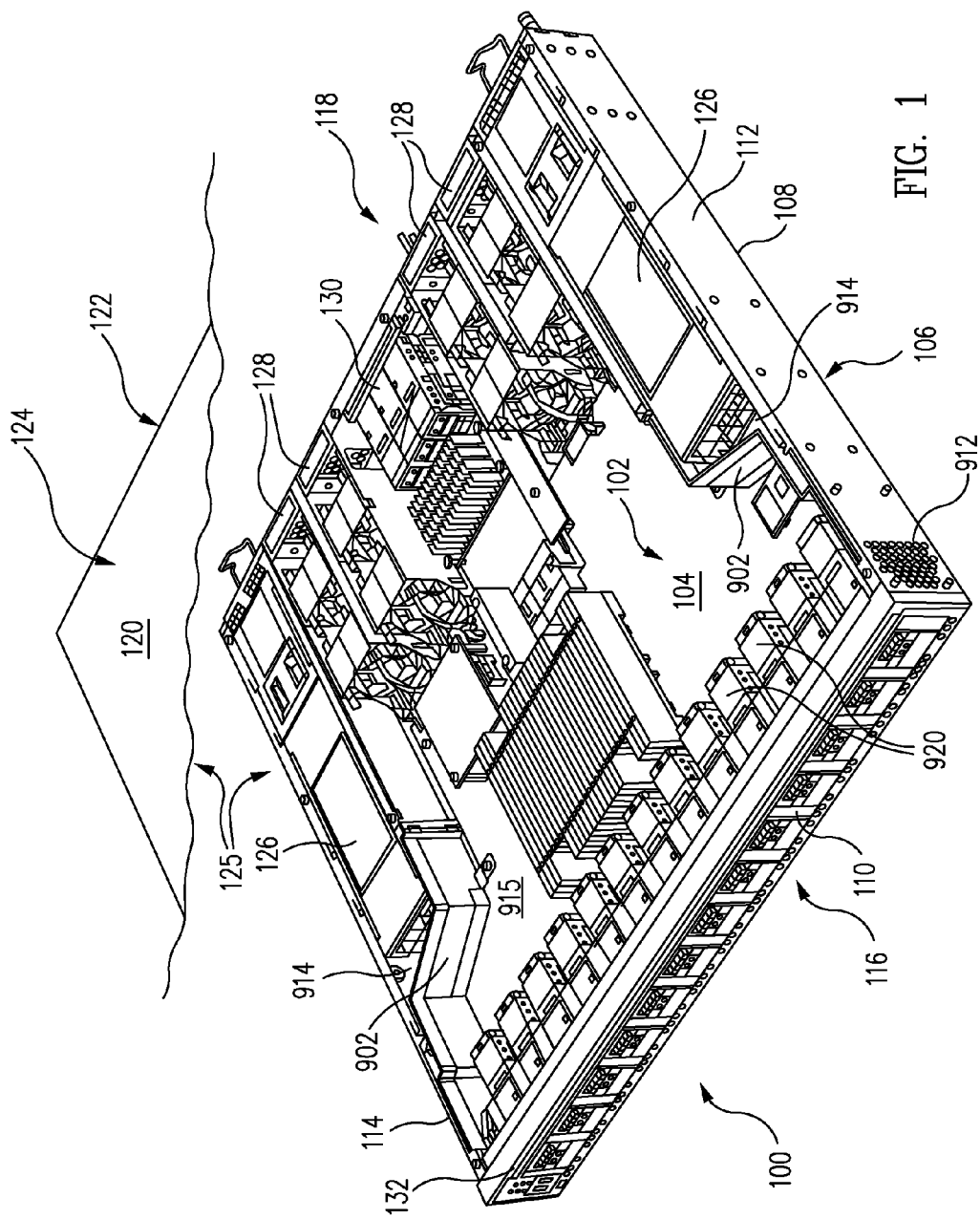
FIG. 1 is an exploded perspective view of an electronic device in accordance with one embodiment.

As an overview and in accordance with one embodiment, referring to FIGS. 1-4, an electronic device 100 includes a fan field replaceable unit (FRU) 128. Fan FRU 128 includes a fan FRU chassis 214 defining an airflow pathway through fan FRU 128. A fan 224 within fan FRU chassis 214 causes air to flow along the airflow pathway. Fan FRU 128 further includes an edge connector 226 located at a front face 202 of fan FRU 128 out of the way of the airflow pathway.

Accordingly, edge connector 226 does not block airflow through fan FRU 128 thus maximizing the efficiency of fan FRU 128 and the cooling of electronic device 100.

Figure 6:
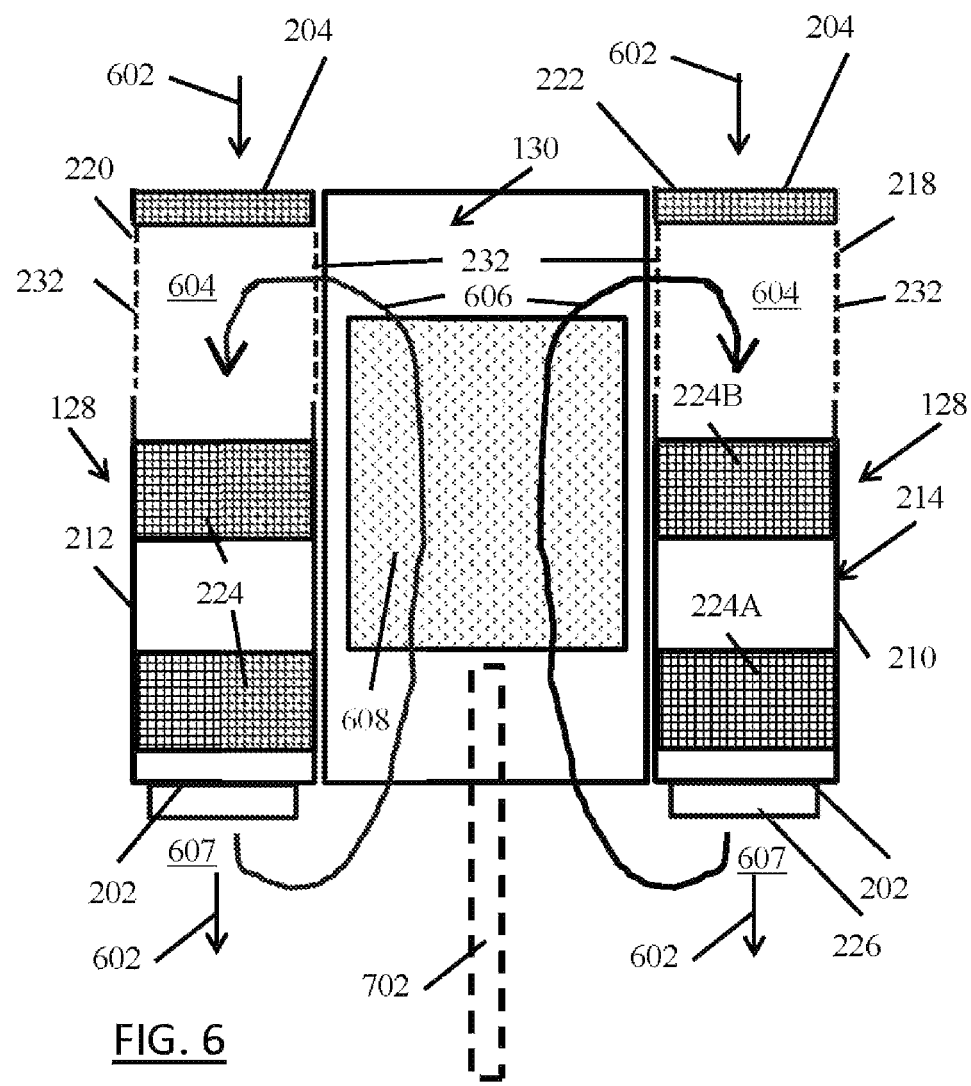
FIG. 6 is a top plan view of a line card and adjacent fan FRUs of the electronic device of FIG. 1 in accordance with one embodiment.

In one embodiment, paying particular attention now to FIG. 6, a fan side electronic component 130 is located between a pair of fan FRUs 128 and at the sides of fan FRUs 128. Fan FRUs 128 include fan FRU chassis sidewalls 218, 220 having side venting ports 232 therein. During operation, air is drawn across fan side electronic component 130 and into side venting ports 232 of fan FRUs 128 as indicated by the arrows 606.

In this manner, airflow is provided to fan side electronic component 130 using multiple airflow paths to provide efficient cooling thereof. This is in contrast to having air flow through fan FRUs 128 bypass fan side electronic component 130.

In accordance with yet another embodiment, paying particular attention now to FIGS. 1, 9, and 10 together, electronic device 100 includes a chassis base 106. Chassis base 106 includes a sidewall 114 having a first airflow port 912 therein and a front plate 110 having a second airflow port 132 therein. An airflow dividing baffle 902 defines a first airflow chamber 914 and a second airflow chamber 915. First airflow port 912 is a port for first airflow chamber 914. Second airflow port 132 is a port for second airflow chamber 915.

By providing airflow dividing baffle 902, heated air discharged from a first electronic component 126 is vented directly to the ambient environment through first airflow chamber 914 and first airflow port 912. The heated air is discharged without preheating other components of electronic device 100 such as those electronic components 920 located within second airflow chamber 915. In this manner, cooling efficiency of electronic device 100 is maximized.

Now in more detail, FIG. 1 is an exploded perspective view of an electronic device 100, sometimes called a pizza box, in accordance with one embodiment. Electronic device 100, e.g., a cryptographic module such as a switch, includes a printed circuit board assembly (PCBA) 102. Printed circuit board assembly 102 includes a printed circuit board 104, sometimes called a larger substrate, and one or more electronic components mounted to printed circuit board 104.

Printed circuit board assembly 102 is mounted to a chassis base 106, sometimes called a chassis bottom.

In accordance with this embodiment, chassis base 106 includes a chassis base plate 108, a front plate 110, a first sidewall 112 and a second sidewall 114. Chassis base plate 108 is a rectangular plate generally parallel to printed circuit board assembly 102. Although various features may be described as being parallel, perpendicular, or having other relations, in light of this disclosure, those of skill in the art will understand that the various features may not be exactly parallel, perpendicular, but only substantially parallel and perpendicular. Further, the features may not be exactly planar, for example, may include indentations or protrusions.

Generally, chassis base plate 108 extends in a first direction, e.g., horizontally. Front plate 110, first sidewall 112, and second sidewall 114 extend perpendicularly vertically upward, e.g., in a second direction perpendicular to the first direction, from chassis base plate 108. For discussion purposes herein, electronic device 100 includes a vertical front face 116 including front plate 110 and various ports therein in a vertical front plane of electronic device 100. Electronic device 100 further includes a vertical rear face 118 that is parallel to front face 116.

Although various features may be described as being horizontal or vertical, it is to be understood that the features extend in a first direction and a perpendicular second direction without a gravitational reference.

First sidewall 112 and second sidewall 114 extend perpendicularly from front plate 110 to rear face 118. First sidewall 112 and second sidewall 114 are parallel to one another.

Electronic device 100 further includes a cover 120, sometimes called a top cover. Cover 120 is cutaway in the view of FIG. 1 to allow visualization of chassis base 106 including the components therein. In accordance with this embodiment, cover 120 is a rectangular plate parallel to chassis base plate 108 when assembled to chassis base 106. Cover 120 includes an inner surface 122 facing towards chassis base 106 and an outer surface 124 facing the ambient environment.

Cover 120 is mounted to chassis base 106, e.g., using screws or other fasteners, to form an electronic enclosure 125 of electronic device 100. In one embodiment, cover 120 and chassis base 106 provide a fixed form-factor chassis, e.g., a chassis having a defined size such as a 1 rack unit (1 RU) size.

In accordance with this embodiment, electronic device 100 includes two Power Supply Units (PSUs) 126, four fan Field Replaceable Units (fan FRUs) 128, and a stacking card 130.

Power supply units 126 are directly adjacent sidewalls 112, 114. Adjacent each power supply unit 126 is a pair of fan FRUs 128. Fan FRUs 128 are sometimes called fan trays. Stacking card 130 is located between the pairs of fan FRUs 128.

In one embodiment, power supply units 126, fan FRUs 128, and stacking card 130 are Field Replaceable Units (FRUs) such that they can be hot swapped. Further, although a particular arrangement of power supply units 126, fan FRUs 128, and stacking card 130 is illustrated in FIG. 1 and discussed above, in other embodiments, electronic device 100 includes other FRUs and/or other arrangements of power supply units 126, fan FRUs 128, and stacking card 130. Further, instead of being a stacking card 130, element 130 is representative of any heat generating electronic component adjacent fan FRUs 128 and thus is sometimes referred to as simply a fan side electronic component 130.

Figure 2:
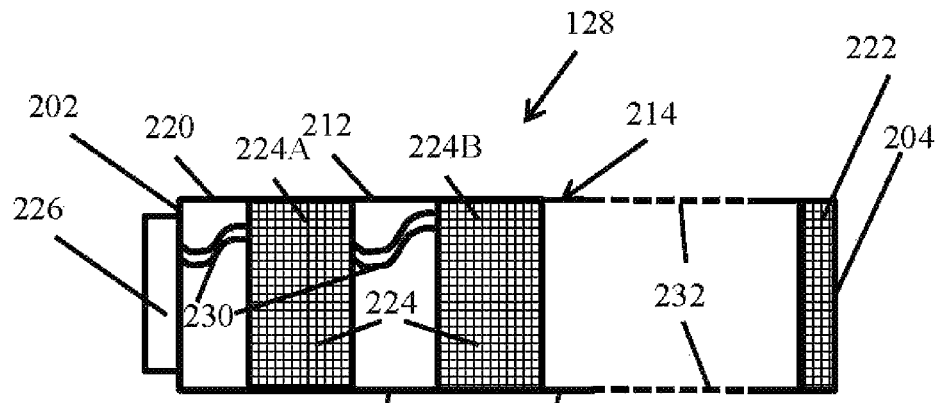
FIG. 2 is a top plan view of a fan FRU of the electronic device of FIG. 1 in accordance with one embodiment.
Figure 3:
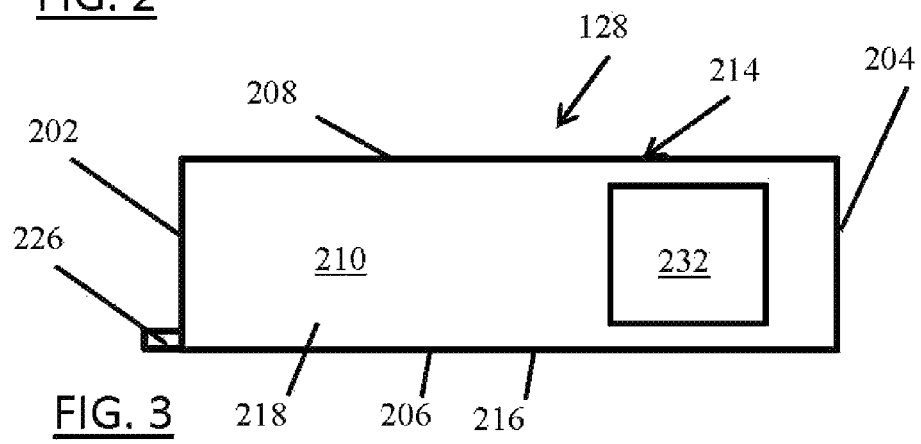
FIG. 3 is a side plan view of the fan FRU of FIG. 2 in accordance with one embodiment.
Figure 4:
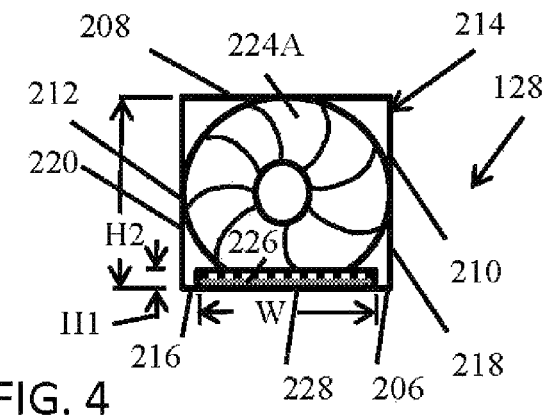
FIG. 4 is a front plan view of the fan FRU of FIG. 2 in accordance with one embodiment.

FIG. 2 is a top plan view of a fan FRU 128 of electronic device 100 of FIG. 1 in accordance with one embodiment. FIG. 3 is a side view of fan FRU 128 of FIG. 2 in accordance with one embodiment. FIG. 4 is a front plan view of fan FRU 128 of FIG. 2 in accordance with one embodiment.

Referring now to FIGS. 1, 2, 3, and 4 together, generally, fan FRU 128 is rectangular and includes a vertical front face 202, a vertical rear face 204, a horizontal bottom 206, a horizontal top 208, a vertical first side 210, and a vertical second side 212. In accordance with this embodiment, rear face 204 is located at rear face 118 of electronic device 100 when fan FRU 128 is installed as illustrated in the view FIG. 1.

Fan FRU 128 includes a fan FRU chassis 214, e.g., formed of sheet metal. In accordance with this embodiment, fan FRU chassis 214 includes a horizontal fan FRU chassis base 216 which defines bottom 206 of fan FRU 128.

Fan FRU chassis 214 further includes a first fan FRU chassis sidewall 218 and a second fan FRU chassis sidewall 220. In accordance with this embodiment, fan FRU chassis sidewalls 218, 220 define sides 210, 212, respectively, of fan FRU 128. Fan FRU chassis sidewalls 218, 220 extend perpendicularly upward from fan FRU chassis base 216 and extend between front face 202 and rear face 204 of fan FRU 128.

Located within fan FRU chassis 214 at rear face 204 is a filter 222. In accordance with one embodiment, filter 222 includes a plurality of openings to allow air flow therethrough. In one embodiment, the openings are sufficiently small to prevent electromagnetic interference (EMI) leakage therethrough. Filter 222 may further include a material to capture (filter) particulates from the air flowing through filter 222 and generally through fan FRU 128 and electronic device 100.

Fan FRU 128 further includes at least one fan 224. Fans 224 are mounted within fan FRU chassis 214. In accordance with this particular embodiment, fan FRU 128 includes a first fan 224A and a second fan 224B, collectively referred to as fans 224. During operation, fans 224 spin to force air through fan FRU 128 and generally through electronic device 100.

More particularly, fans 224 cause air to flow along an airflow pathway defined by fan FRU chassis 214. Air flows along the airflow pathway from rear face 204 though fan FRU chassis 214 and exits front face 202.

Located at front face 202 of fan FRU 128 is an edge connector 226. Edge connector 226 is located out of the airflow pathway of air through fan FRU 128. In accordance with this embodiment, edge connector 226 is located at the front facing edge of bottom 206 of fan FRU 128. More particularly, edge connector 226 is located at front face 202 at bottom 206.

In this embodiment, edge connector 226 is a long strip, e.g., having a width W in the horizontal direction much greater than a height H1 in the vertical direction. Accordingly, edge connector 226 extends along bottom 206 between sides 210, 212, although may not extend completely to sides 210, 212. In one particular embodiment, edge connector 226 is mounted to bottom 206 and/or sides 210, 212.

Paying particular attention to FIG. 4, edge connector 226 sits upon or is mounted to fan FRU chassis base 216. For example, a bottom 228 of edge connector 226 is parallel to fan FRU chassis base 216. Accordingly, edge connector 226 extends height H1, sometimes called a first height, of edge connector 226 from bottom 206 of fan FRU 128.

In one embodiment, height H1 of edge connector 226 is less than 50% of a height H2, sometimes called a second height, of fan FRU 128. In one particular example, height H1 of edge connector 226 is less than 20% of a height H2 of fan FRU 128, e.g., H2 is 40 mm and H1 is less than or equal to 8 mm.

By locating edge connector 226 at bottom 206 of fan FRU 128, edge connector 226 is placed out of the way of airflow through fan FRU 128. Accordingly, edge connector 226 does not block airflow through fan FRU 128 thus maximizing the efficiency of fan FRU 128 and cooling of electronic device 100.

Although a single fan FRU 128 is described in detail with reference to FIGS. 2-4, in light of this disclosure, those of skill in the art will understand that the other fan FRUs 128 are similar or identical to the described fan FRU 128.

Figure 5:
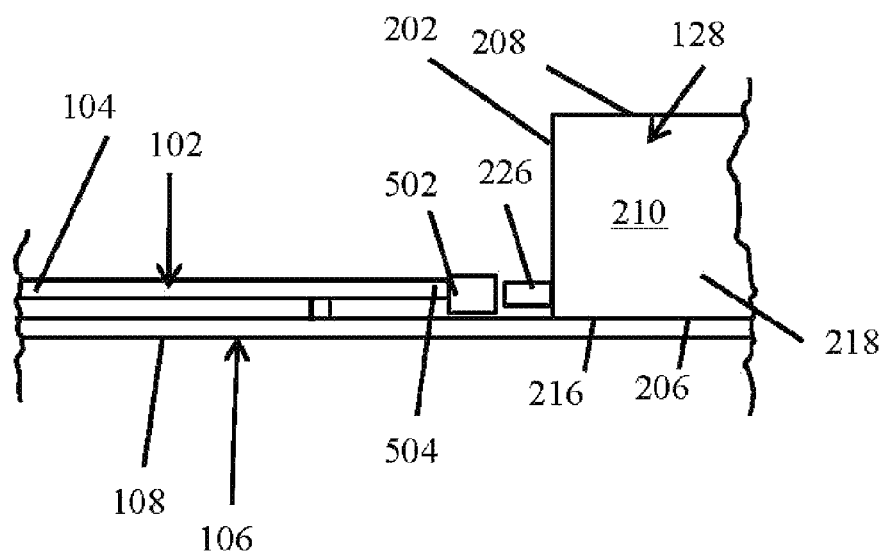
FIG. 5 is a side plan view of an edge connector of the fan FRU of FIG. 2 aligned with a corresponding PCBA edge connector of a printed circuit board assembly in accordance with one embodiment.

FIG. 5 is a side plan view of edge connector 226 of fan FRU 128 of FIG. 2 aligned with a corresponding printed circuit board assembly (PCBA) edge connector 502 of printed circuit board assembly 102 in accordance with one embodiment. In FIG. 5, fan FRU 128 is spaced apart and disconnected from printed circuit board assembly 102. For example, fan FRU 128 is illustrated at a position immediately prior to being coupled to printed circuit board assembly 102. Motion to the left in the view of FIG. 5 of fan FRU 128 connects edge connector 226 with PCBA edge connector 502.

Edge connector 226 is an interface to provide electrical coupling of fan FRU 128 with corresponding PCBA edge connector 502 of printed circuit board assembly 102. Edge connector 226 is configured to mate with PCBA edge connector 502, sometimes called a mating connector. Illustratively, electrical power to drive fans 224 of fan FRU 128 is provided through the interface of edge connector 226 and PCBA edge connector 502. For example, wires 230 (see FIG. 2) electrically connect edge connector 226 to fans 224.

In accordance with this embodiment, PCBA edge connector 502 is located at a rear edge 504 of printed circuit board 104 of printed circuit board assembly 102. This allows edge connector 226 of fan FRU 128 to be located at bottom 206 of fan FRU 128 and out of the way of airflow.

FIG. 6 is a top plan view of stacking card 130 and adjacent fan FRUs 128 of electronic device 100 of FIG. 1 in accordance with one embodiment. The other features of electronic device 100 are not illustrated in FIG. 6 for purposes of simplicity.

Paying particular attention now to FIGS. 1, 2, 3, and 6 together, fan FRU chassis sidewalls 218, 220 are formed with side venting ports 232, sometimes called apertures or openings. In accordance with this embodiment, side venting ports 232 are formed in fan FRU chassis sidewalls 218, 220 between fan 224B and filters 222 and more generally between fan 224B and rear face 204 of fan FRU 128.

In one embodiment, fans 224 move air from rear faces 204 to front faces 202 of fan FRUs 128 as indicated by the arrows 602. The air exits through a main airflow port 132 in front plate 110 of chassis base 106. In this embodiment, main airflow port 132 is a plurality of openings to allow air flow therethrough. In one embodiment, the openings are sufficiently small to prevent EMI leakage therethrough.

Low pressure regions 604 between fans 224B and filters 222 are created due to fans 224. By locating side venting ports 232 at regions 604, air is drawn from outside of fan FRUs 128 through side venting ports 232 and into regions 604.

Further, stacking card 130 is formed with an absence of sidewalls or other structures to block side venting ports 232. Stacking card 130 is directly adjacent sidewalls 218, 220 of fan FRUs 128 at rear face 118 of electronic device 100.

Accordingly, air is drawn across stacking card 130 and into side venting ports 232 of fan FRUs 128 as indicated by the arrows 606. More particularly, due to fans 224, high pressure regions 607 are created directly outside of front faces 202. Thus, a portion of the air discharged from front faces 202 of fan FRUs 128 is drawn from high pressure regions 607 across stacking card 130 and into side venting ports 232 of fan FRUs 128 as indicated by the arrows 606. For example, stacking card 130 includes an electronic component 608, e.g., a heat sink, across which air is drawn.

In this manner, airflow is provided to stacking card 130 using multiple airflow paths to provide efficient cooling thereof. This is in contrast to having air flow through fan FRUs 128 bypass stacking card 130.

As set forth above, fans 224 move air from rear face 204 to front face 202 of fan FRUs 128 as indicated by the arrows 602. However, in another embodiment, fans 224 move air from front face 202 to rear face 204 of fan FRUs 128 in a direction opposite the arrows 602.

In accordance with this embodiment, regions 604 between fans 224B and filters 222 are high-pressure regions and regions 607 are low pressure regions created due to fans 224. By locating side venting ports 232 at regions 604, air is blown from regions 604 inside of fan FRUs 128 through side venting ports 232 and out of fan FRUs 128.

Further, the air blown out of side venting ports 232 is drawn across stacking card 130 and into regions 607 and front faces 202 of fan FRUs 128 in a direction opposite the arrows 606. In this manner, airflow is provided to stacking card 130 to provide efficient cooling thereof regardless of whether airflow is from front faces 202 to rear faces 204 of fan FRUs 128 or vice versa.

As set forth above, a much larger airflow cross section is provided to stacking card 130 through multiple airflow paths while still maintaining a small form factor for electronic device 100.

Figure 7:
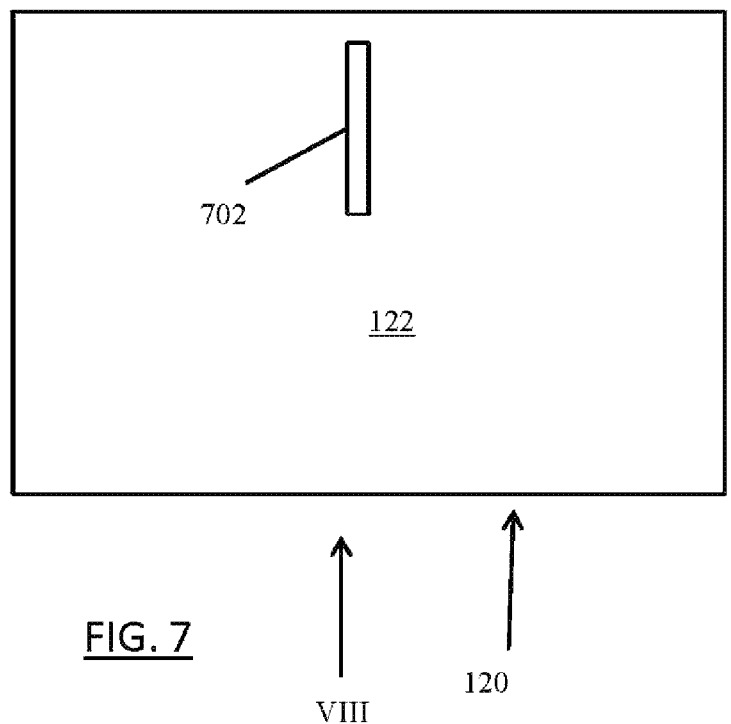
FIG. 7 is a bottom plan view of a cover including an airflow baffle of the electronic device of FIG. 1 in accordance with one embodiment.
Figure 8:
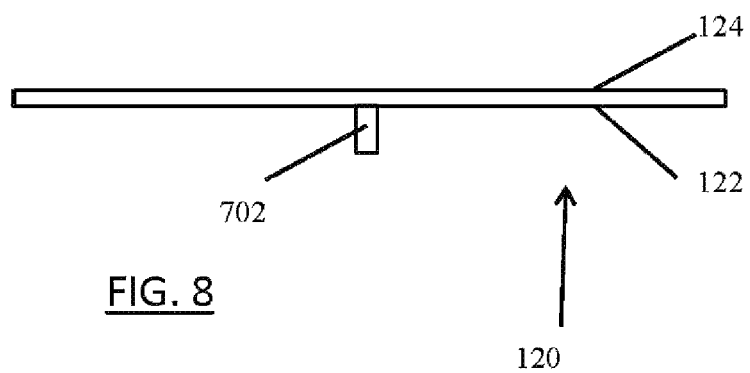
FIG. 8 is a side plan view of the cover and the airflow baffle from the direction VIII of FIG. 7 in accordance with one embodiment.

FIG. 7 is a bottom plan view of cover 120 including an airflow baffle 702 of electronic device 100 of FIG. 1 in accordance with one embodiment. FIG. 8 is a side plan view of cover 120 and airflow baffle 702 from the direction VIII of FIG. 7 in accordance with one embodiment. Note airflow baffle 702 is indicated by the dashed rectangle in FIG. 6.

Referring now to FIGS. 6, 7, and 8 together, in accordance with this embodiment, airflow baffle 702 extends from inner surface 122 of cover 120. In one embodiment, airflow baffle 702 is a rectangular strip extending perpendicularly from inner surface 122 of cover 120. As shown in FIG. 6, airflow baffle 702 is parallel to fan FRUs 128, e.g., extends in a direction parallel to sidewalls 112, 114 of electronic device 100.

Further, airflow baffle 702 is located above and/or immediately in front of stacking card 130. Airflow baffle 702 is between the fan FRUs 128 adjacent stacking card 130. Airflow baffle 702 directs air from fan FRUs 128 to stacking card 130.

In one embodiment, airflow baffle 702 insures that stacking card 130 receives airflow and thus cooling even in the event of failure of one of fan FRUs 128. To illustrate, as discussed above, during normal operation of both fan FRUs 128 to the right and left of stacking card 130 in the view of FIG. 6, air flows from high pressure regions 607 across stacking card 130 and into low pressure regions 604.

However, should the left (or right) fan FRU 128 fail, absent airflow baffle 702, region 607 of the failed left (or right) fan FRU 128 can become a low pressure region due to lack of airflow to the region 607. Thus, absent airflow baffle 702, the air from the high pressure region 607 of the right (or left) functioning fan FRU 128 could be drawn to the low pressure region 607 of the left (or right) failed fan FRU 128 rather than circulating across stacking card 130. Thus, absent airflow baffle 702, failure of the left (or right) fan FRU 128 could cause insufficient airflow to and cooling of stacking card 130.

However, airflow baffle 702 insures sufficient airflow to and cooling of stacking card 130 even in the event of failure of the left (or right) fan FRU 128. More particularly, even if the left (or right) fan FRU 128 fails, the region 607 of the failed left (or right) fan FRU 128 remains a high pressure region due to the physical separation between the regions 607 by airflow baffle 702.

Thus, facilitated at least in part by airflow baffle 702, the air from the high pressure region 607 of the right (or left) functioning fan FRU 128 continues to circulates across stacking card 130 and to low pressure region 604 of the right (or left) functioning fan FRU 128. Thus, facilitated at least in part by airflow baffle 702, stacking card 130 continues to receive adequate airflow and cooling even in the event of failure of a fan FRU 128.

Figure 11:
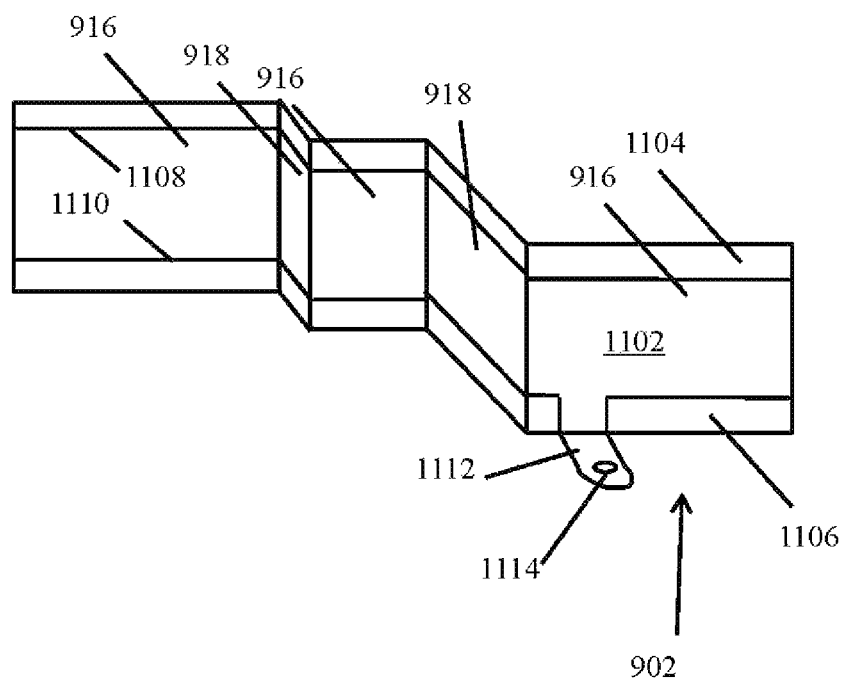
FIG. 11 is a perspective view of a power supply unit (PSU) baffle of the electronic device of FIG. 1 in accordance with one embodiment.

FIG. 9 is a top plan view of a portion of electronic device 100 of FIG. 1 including second sidewall 114 and the adjacent power supply unit 126 in accordance with one embodiment. FIG. 10 is a side plan view of second sidewall 114 of electronic device 100 of FIG. 1 in accordance with one embodiment. FIG. 11 is a perspective view of a power supply unit (PSU) baffle 902 of electronic device 100 of FIG. 1 in accordance with one embodiment.

Referring now to FIGS. 1, 9, 10, and 11 together, power supply unit 126 is mounted within electronic device 100 directly adjacent to or in abutting contact with second sidewall 114. As indicated by the dashed rectangle in FIG. 9, power supply unit 126 includes a power supply unit (PSU) fan 904. PSU fan 904 is built into power supply unit 126 although can be a separate fan in other embodiments.

Power supply unit 126 includes a front face 906 and a rear face 908. In accordance with this embodiment, rear face 908 is located at rear face 118 of electronic device 100 when power supply unit 126 is installed as illustrated in the view FIGS. 1, 9.

Generally, power supply unit 126 is mounted within chassis base 106 of electronic device 100.

During use, power supply unit 126 generates heat. PSU fan 904 drives air through power supply unit 126 to cool power supply unit 126. More particularly, PSU fan 904 causes air to travel in the direction of arrow 910 to enter power supply unit 126 through rear face 908 and to exit power supply unit 126 through front face 906.

As the air travels through power supply unit 126, the air becomes heated. However, this heated air exiting front face 906 of power supply unit 126 is directed by PSU baffle 902 to a power supply unit (PSU) airflow port 912 formed within second sidewall 114 of chassis base 106 of electronic device 100.

In this embodiment, PSU airflow port 912 is a plurality of openings to allow air flow therethrough. In one embodiment, the openings are sufficiently small to prevent EMI leakage therethrough.

More particularly, a PSU airflow chamber 914 is defined between PSU baffle 902 and second sidewall 114. PSU airflow chamber 914 is isolated from a main system airflow chamber 915 by PSU baffle 902. Heated air discharged from power supply unit 126 flows through PSU airflow chamber 914 to PSU airflow port 912 within second sidewall 114. This heat air is discharged from PSU airflow chamber 914 through PSU airflow port 912 to the ambient environment. PSU airflow port 912 is a port for PSU airflow chamber 914.

By providing PSU baffle 902, heated air discharged from power supply unit 126 is vented directly to the ambient environment without preheating other components of electronic device 100. In this manner, cooling efficiency of electronic device 100 is maximized.

As illustrated in FIG. 9, PSU airflow chamber 914 becomes smaller in width as the distance from power supply unit 126 increases. More particularly, PSU baffle 902 tapers towards second sidewall 114.

In the particular embodiment illustrated, PSU baffle 902 includes parallel portions 916 and angled portions 918. Parallel portions 916 are generally parallel to second sidewall 114. Angled portions 918 extend at an angle from parallel portions 916 and are directed towards second sidewall 114. Although PSU baffle 902 is illustrated as including three parallel portions 916 and two angled portions 918, in other embodiments, PSU baffle 902 has other tapering shapes to narrow airflow chamber 914.

By narrowing airflow chamber 914, PSU baffle 902 reduces the amount of area within electronic device 100 for airflow chamber 914. This allows front face electronic components 920 to be located at front face 116 of electronic device 100 directly in front of power supply unit 126. Absent PSU baffle 902, these front face electronic components 920 would be preheated from the heated air exiting power supply unit 126. Illustratively, front face electronic components 920 are transceiver media cages such as QSFP transceiver cages (e.g., 1×2), SFP transceiver cages, or RJ 45 cages.

In another embodiment, PSU fan 904 causes air to travel in a direction opposite the direction of arrow 910 to enter power supply unit 126 through front face 906 and to exit power supply unit 126 through rear face 908.

In accordance with this embodiment, ambient air is drawn into PSU airflow chamber 914 through PSU airflow port 912. The ambient air travels through PSU airflow chamber 914 and is provided to power supply unit 126. Accordingly, the air provided to power supply unit 126 is ambient air that is not preheated by other electronic components of electronic device 100. In this manner, cooling efficiency of electronic device 100 is maximized.

In one embodiment, PSU baffle 902 forms an airtight seal between cover 120 and PCBA 102 and/or chassis base plate 108. Paying particular attention to FIGS. 1, 11, to provide this airtight seal, PSU baffle 902 includes a rigid core 1102, an upper, e.g., first, seal 1104, and a lower, e.g., second, seal 1106. Rigid core 1102 is formed of a rigid material such as sheet metal and provides strength and integrity to PSU baffle 902.

Rigid core 1102 includes an upper, e.g., first, edge 1108 and a lower, e.g., second, edge 1110. Lower seal 1106 is attached, e.g., with adhesive, a mechanical fastener, or other attachment element, to rigid core 1102 and extends downward from lower edge 1110 of rigid core 1102.

In one embodiment, PSU baffle 902 includes one or more mounting flanges 1112 at lower seal 1106. Mounting flange 1112 projects perpendicularly outward from rigid core 1102 at lower seal 1106. In one embodiment, mounting flange 1112 and rigid core 1102 are integral, i.e., parts of a single piece and not separate pieces connected together. For example, a single piece of sheet metal is bent to form rigid core 1102 and mounting flange 1112.

Mounting flange 1112 includes a mounting aperture 1114 formed therein. A screw or other fastener is passed through mounting aperture 1114 and screwed or otherwise coupled to PCBA 102 and/or chassis base plate 108 to mount PSU baffle 902 in place.

As the screw is tightened, lower seal 1106, e.g., foam, is compressed between lower edge 1110 of rigid core 1102 and PCBA 102 and/or chassis base plate 108. In this manner, lower seal 1106 forms an airtight seal between lower edge 1110 of rigid core 1102 and PCBA 102 and/or chassis base plate 108. More generally, lower seal 1106 forms an airtight seal between PSU baffle 902 and PCBA 102 and/or chassis base plate 108 of chassis base 106.

Upper seal 1104 is attached, e.g., with adhesive, a mechanical fastener, or other attachment element, to rigid core 1102 and extends upward from upper edge 1108 of rigid core 1102. When cover 120 is mounted in place, upper seal 1104, e.g., foam, is compressed between upper edge 1108 of rigid core 1102 and cover 120. In this manner, upper seal 1104 forms an airtight seal between upper edge 1108 of rigid core 1102 and cover 120. More generally, upper seal 1104 forms an airtight seal between PSU baffle 902 and cover 120.

Although a single power supply unit 126, PSU baffle 902, and second sidewall 114 are discussed in detail and illustrated in FIGS. 9-11, in light of this disclosure, those of skill in the art will understand that the discussion is equally applicable to the other power supply unit 126, PSU baffle 902, and first sidewall 112 (see FIG. 1).

Further, PSU baffle 902 is discussed above as separating PSU airflow chamber 914 in which power supply unit 126 is located from a main airflow chamber 915 in which front face electronic components 920 are located. Generally, PSU baffle 902, sometimes called an airflow dividing baffle 902, separates the electronic enclosure 125 defined by chassis base 106 and cover 120 into two distinct airflow chambers 914, 915, sometimes called first and second airflow chambers 914, 915.

Accordingly, PSU baffle 902 prevents convective heat transfer from a first electronic component within airflow chamber 914, e.g., power supply unit 126, to a second electronic component within airflow chamber 915, e.g., a front face electronic component 920. Airflow is provided to/from airflow chamber 914 through PSU airflow port 912, sometimes called a first airflow port 912, within sidewall 114 of chassis base 106. In contrast, airflow is provided to/from airflow chamber 915 through main airflow port 132, sometimes called a second airflow port 132, within front plate 110 of chassis base 106. Main airflow port 132 is a port for main airflow chamber 915. A port is an opening or a plurality of openings through which air can flow.

As set forth above, air flow and cooling of electronic device 100 is efficiently achieved without providing additional and/or larger fans. By avoiding additional and/or larger fans, power consumption of electronic device 100 is minimized as well as the fabrication cost of electronic device 100. This allows use of small power supply units 126 and less associated heat removal from electronic device 100. Further, by avoiding additional and/or larger fans, the space saved can be used for additional ports to make electronic device 100 a higher density switch.

The drawings and the forgoing description gave examples of embodiments. The scope of the embodiments, however, is by no means limited by these specific examples. Numerous variations, whether explicitly given in the specification or not, such as differences in structure, dimension, and use of material, are possible.

What is claimed is:

1. A structure comprising:
    a fan field replaceable unit (FRU) comprising:
        a fan FRU chassis defining an airflow pathway through the fan FRU, wherein the fan FRU chassis comprises:
            a fan FRU chassis base defining a bottom of the fan FRU;
            a first sidewall extending from the fan FRU chassis base;
            a second sidewall extending from the fan FRU chassis base, the second sidewall being parallel to the first sidewall; and
            side venting ports in the first and second sidewalls;
        a fan within the fan FRU chassis configured to cause air to flow along the airflow pathway; and
        an edge connector located at a front face of the fan FRU out of the way of the airflow pathway.

2. The structure of claim 1 wherein the edge connector is located at a bottom of the fan FRU.

3. The structure of claim 2 wherein the edge connector is located at a front facing edge of the bottom.

4. The structure of claim 2 wherein the edge connector extends along the bottom between sides of the fan FRU.

5. The structure of claim 2 wherein the edge connector extends a first height from the bottom and the fan FRU has a second height, the first height being less than 20% of the second height.

6. The structure of claim 1 further comprising:
    a mating connector configured to mate with the edge connector.

7. The structure of claim 6 further comprising:
    a printed circuit board assembly comprising the mating connector.

8. The structure of claim 1 wherein the side venting ports are formed between the fan and a rear face of the fan FRU.

9. The structure of claim 1
    further comprising a fan side electronic component directly adjacent the first sidewall.

10. The structure of claim 9 wherein the fan is configured to cause air to flow across the fan side electronic component through the side venting port in the first sidewall.

11. The structure of claim 9 further comprising a cover comprising an airflow baffle configured to direct airflow from the fan FRU to the fan side electronic component.

12. A structure comprising: a chassis base comprising:
a first sidewall comprising a first airflow port therein; and
a front plate comprising a second airflow port therein;
an airflow dividing baffle defining a first airflow chamber and a second airflow chamber, the first airflow port being a port for the first airflow chamber, the second airflow port being a port for the second airflow chamber; and a first electronic component in the first airflow chamber, the airflow dividing baffle tapering towards the first sidewall as the distance from the first electronic component increases, the airflow dividing baffle comprising: at least two parallel portions parallel to the first sidewall; an angled portion interposed between the parallel portions and extending at an angle towards the first sidewall; and a mounting flange projecting outward from one of the parallel portions or the angled portion.

13. The structure of claim 12 further comprising a cover coupled to the chassis base, the cover and chassis base defining an enclosure comprising the first airflow chamber and the second airflow chamber.

14. The structure of claim 13 wherein the airflow dividing baffle comprises a first seal forming a seal with the cover.

15. The structure of claim 14 wherein the airflow dividing baffle comprises a second seal forming a seal with a chassis base plate of the chassis base.

16. The structure of claim 12 wherein the airflow dividing baffle comprises:
a core;
a first seal extending from a first edge of the core; and
a second seal extending from a second edge of the core.

17. The structure of claim 16 wherein the first seal comprises foam, the rigid core comprises sheet metal, and the second seal comprises foam.

18. A method comprising:
forming a seal between a chassis base and an airflow dividing baffle;
forming a seal between a cover and the airflow dividing baffle;
causing air to flow past a first electronic component and through a first airflow chamber, the first airflow chamber comprising a first airflow port in a first sidewall of the chassis base, the airflow dividing baffle tapering towards the first sidewall as the distance from the first electronic component increases; and
causing air to flow past a second electronic component and through a second airflow chamber, the second airflow chamber comprising a second airflow port, the second airflow chamber being isolated from the first airflow chamber by the airflow dividing baffle, the airflow dividing baffle comprising:
at least two parallel portions parallel to the first sidewall;
an angled portion interposed between the parallel portions and extending at an
angle towards the first sidewall; and
a mounting flange projecting outward from one of the parallel portions or the angled portion.

19. The method of claim 18 further comprising:
preventing convective heat transfer from the first electronic component to the second electronic component with the airflow dividing baffle.

20. The structure of claim 1 wherein the fan FRU is a first fan FRU, the structure further comprising:
a second fan FRU;
a fan side electronic component between the first fan FRU and the second fan FRU; and
a cover comprising an airflow baffle, the airflow baffle being parallel to the first sidewall and between the first fan FRU and the second fan FRU.

* * * * *